United States Patent [19]

Sato

[11] Patent Number: 4,922,316

[45] Date of Patent: May 1, 1990

[54] INFANT PROTECTION DEVICE

[75] Inventor: Yoshinori Sato, Tokyo, Japan

[73] Assignee: NEC Corporation, Japan

[21] Appl. No.: 290,847

[22] Filed: Dec. 29, 1988

Related U.S. Application Data

[63] Continuation of Ser. No. 864,091, May 16, 1986, abandoned.

[30] Foreign Application Priority Data

May 17, 1985 [JP] Japan ................................ 60-105517

[51] Int. Cl.$^5$ .......................................... H01L 27/02
[52] U.S. Cl. .................... 357/41; 357/23.13; 357/23.6; 357/84
[58] Field of Search ...................... 357/23.13, 23.6, 84, 357/41

[56] References Cited

U.S. PATENT DOCUMENTS

| | | | |
|---|---|---|---|
| 4,527,213 | 7/1985 | Ariizumi | 357/23.13 |
| 4,541,002 | 9/1985 | Shimada | 357/23.13 |
| 4,543,597 | 9/1985 | Shibata | 357/23.13 |

FOREIGN PATENT DOCUMENTS

| | | | |
|---|---|---|---|
| 0136279 | 10/1979 | Japan | 357/23.13 |
| 0140481 | 10/1979 | Japan | 357/23.13 |
| 56-2663 | 1/1981 | Japan | 357/23.13 |
| 58-123768 | 7/1983 | Japan | 357/23.13 |
| 59-74665 | 4/1984 | Japan | 357/23.13 |
| 0198762 | 11/1984 | Japan | 357/23.13 |
| 0038266 | 2/1988 | Japan | 357/23.1 |
| 0215493 | 3/1987 | United Kingdom | 357/23.13 |

Primary Examiner—Rolf Hille
Assistant Examiner—Hoanganh Le
Attorney, Agent, or Firm—Laff, Whitesel, Conte & Saret

[57] ABSTRACT

An input protection device for a semiconductor integrated circuit, comprising a semiconductor substrate of one conductivity type, a first insulator layer formed on the substrate and having an opening extending to the surface of the substrate, a doped region formed in the opening for contacting the substrate, the doped region being of the other conductivity type and forming a p-n junction at its interface with the substrate, an input protection resistor region having a portion contacting the doped region through the opening in the first insulator layer and a portion overlapping the first insulator layer, a second insulator layer having a portion covering the input protection resistor region, the portion of the second insulator layer having an opening extending to the surface of the resistor region, the opening in the second insulator layer being at least in part in registry with the opening in the first insulator layer, and a metallized input wiring layer formed on the second insulator layer and having a region extending through the opening in the second insulator layer to the surface of the protection resistor region. The p-n junction formed between the substrate and the doped region provides a diode to be reversed biased by the voltage to be normally applied to the input transistor and is operative to pass therethrough a current with a high voltage surge.

4 Claims, 4 Drawing Sheets

INFANT PROTECTION DEVICE

This application is a continuation of application Ser. No. 06/864,091, filed May 16, 1986 now abandoned.

FIELD OF THE INVENTION

The present invention relates in general to semiconductor integrated circuits and in particular to an input protection device or, more particularly to a surge voltage suppressor for use in a semiconductor integrated circuit.

DESCRIPTION OF THE PRIOR ART

An input protection device for use in a semiconductor integrated circuit is known which uses an input protective resistor formed by a patterned polysilicon layer over a silicon substrate. Such an input protection device is useful as a surge voltage suppressor for protecting an input transistor of the integrated circuit from a momentary voltage surge which is likely to occur during operation of the integrated circuit.

FIG. 1 of the drawings shows the equivalent circuit of a conventional input protection device of this nature. As shown, the prior-art input protection device, generally represented by reference numeral 10, is provided for a semi-conductor integrated circuit including an input rod 10 and an input transistor 14. The input protection device 10 includes a series combination of input protection resistors 16 and 18 connected between the input rod 10 and the input transistor 14. An input protection transistor 20 has its source and drain connected between ground and a circuit node 22 between the resistors 16 and 18 with its gate also connected to ground. Each of the transistors 14 and 20 is assumed to be an n-channel field-effect device.

FIGS. 2 and 3 of the drawings show a portion "A" of a semiconductor integrated circuit structure including the input protection device thus constructed and arranged. The input protection resistors 16 and 18 are now commonly represented by a patterned polysilicon resistor region 17 which is formed over a silica substrate 22, as shown in FIG. 3. The substrate 24, which is herein assumed to be of p-type silicon, has a thin layer 26 of silicon oxide having the polysilicon resistor region 17 directly formed thereon. The polysilicon resistor region 17 and the silicon oxide layer 24 are covered with a conformally deposited insulator layer 30 which is formed with a contact hole 28 extending to the surface of the resistor region 17. A metallized input wiring layer 32 is deposited on this insulator layer 30 and has a contact region extending through the contact hole 28 in the insulator layer 30 to the surface of the polysilicon resistor region 17, thereby providing electrical connection between the input rod 10 and the resistor region 17, viz., each of the input protection resistors 16 and 18 in the arrangement shown in FIG. 1.

BACKGROUND OF THE INVENTION

During operation of the integrated circuit including the input protection device thus constructed in the semiconductor structure, a current caused by a high voltage surge may occur at the input rod 10 of the circuit. As the current is passed through the input protection resistors 16 and 18 to the input transistor 14, the high voltage surge is on one hand attenuated by the input protection resistors 16 and 18 and is on the other hand taken up by means of the input protection transistor 20. In the semiconductor structure shown in FIGS. 2 and 3, the current flowing through the metallized input wiring layer 32 as caused by the voltage surge is applied from the input wiring layer 30 to the polysilicon resistor region 17 and may damage the polysilicon at the contact surface of the resistor region with the metallized input wiring layer 32. When this takes place, the patterned polysilicon resistor region 17 is broken and is disabled from attenuating the high voltage surge of the current flowing through the metallized layer. The present invention contemplates provision of a useful solution to such a problem inherent in an input protection device serving as a voltage surge suppressor.

It is, accordingly, a prime object of the present invention to provide a semiconductor integrated circuit having an input protection device providing reliability of operation responsive to a high voltage surge which may occur at an input to an input transistor of the circuit.

SUMMARY OF THE INVENTION

In accordance with one outstanding aspect of the present invention, there is provided an input protection device for a semiconductor integrated circuit, comprising (a) a semiconductor substrate of a first conductivity type;

(b) a first insulator layer on the substrate, the first insulator layer having an opening extenting to the surface of the substrate;

(c) a doped region formed in and substantially coextensive with the opening in the first insulator layer for contacting the substrate, the doped region being of a second conductivity type opposite to the first conductivity type and forming a p-n junction at its interface with the substrate;

(d) a patterned input protection resistor region having a portion contacting the doped region through the opening in the first insulator layer and a portion overlapping the first insulator layer;

(e) a second insulator layer having a portion covering the input protection resistor region, the portion of the second insulator layer having an opening extending to the surface of the resistor region, the opening in the second insulator layer being at least in part in registry with the opening in the first insulator layer; and (f) a metallized layer on the second insulator layer, the metallized input wiring layer having a region extenting through the opening in the second insulator layer to the surface of the input protection resistor region.

An input proection device thus constructed in accordance with the present invention may further comprise a field-effect transistor having its source and drain connected between the input protection resistor region and ground for providing an input transistor.

In accordance with another outstanding aspect of the present invention, there is provided an input protection device for protecting a transistor in a semiconductor integrated circuit including a reference voltage terminal, comprising (a) an input pad;

(b) a series circuit composed of first and second resistors and having an intermediate junction between the first and second resistors;

(c) an input wiring element through which the series circuit is connected at one end thereof to the input pad, the series circuit being coupled at the other end thereof to the aforesaid transistor to be protected;

(d) a protection field-effect transistor having its drain-source current path connected between the aforesaid intermediate junction and the aforesaid reference voltage terminal; and (e) a protection diode connected in reverse direction between the aforesaid one end of the series circuit and the reference voltage terminal, the protection diode including ($e_1$) a semiconductor substrate of a first conductivity type, ($e_2$) a doped region in the substrate, the doped region being of a second conductivity type opposite to the first conductivity type, ($e_3$) an insulator layer on the substrate, the insulator layer having an opening allowing at least a portion of the doped region to be exposed therethrough, ($e_4$) a polysilicon wiring layer formed on the insulator layer and contacting the doped region through the opening in the insulator layer, the polysilicon wiring layer providing the aforesaid series circuit, and ($e_5$) and a metallized wiring layer formed on the substrate and contacting the polysilicon wiring layer, the metallized wiring layer providing the aforesaid input wiring element.

BRIEF DESCRIPTION OF THE DRAWINGS

The features and advantages of an input protection device according to the present invention will be more clearly understood from the following description taken in conjunction with the accompanying drawings in which like reference numerals designate similar or corresponding structures, elements and portions and which.

DESCRIPTION OF THE PREFERRED EMBODIMENTS

Figure 1:
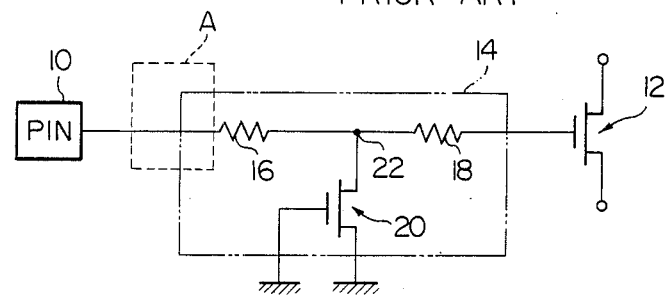
FIG. 1 is a schematic circuit diagram view showing the equivalent circuit arrangement of a typical prior-art input protection device serving as a voltage surge suppressor in a semiconductor integrated circuit.
Figure 4:
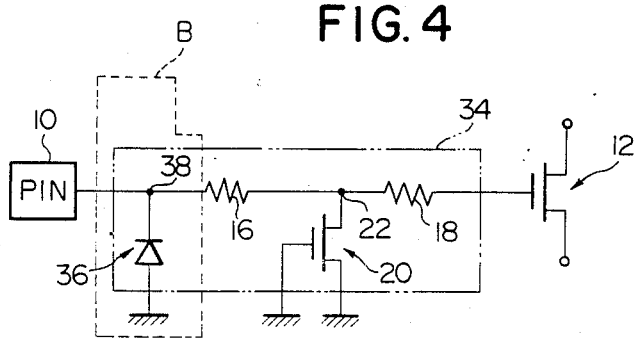
FIG. 4 is a schematic circuit diagram view showing the equivalent circuit arrangement of a preferred embodiment of an input protection device for use as a voltage surge suppressor in a semiconductor integrated circuit in accordance with the present invention.

Referring to FIG. 4 of the drawings, an input protection device embodying the present invention, now represented in its entirety by reference numeral 34, is also provided for a semiconductor integrated circuit including an input rod 10 and an input transistor 12 which is assumed to be an n-channel field-effect device. Similarly to its prior-art counterpart shown in FIG. 1, the input protection device 34 comprises a series combination of input protection resistors 16 and 18 and an input protection transistor 20. The input protection resistors 16 and 18 are connected in series between the input rod 10 and the input transistor 14 while the input protection transistor 20, which is also assumed to be an n-channel field-effect device, has its drain connected to a circuit node 22 between the resistors 16 and 18, the source and gate of the transistor 20 being connected to ground. In accordance with the present invention, the input protection device 34 further comprises a diode 36 having its cathode connected to a circuit node 38 between the input rod 10 and the series combination of the input protection resistors 16 and 18 and its anode connected to ground as shown.

Figure 2:
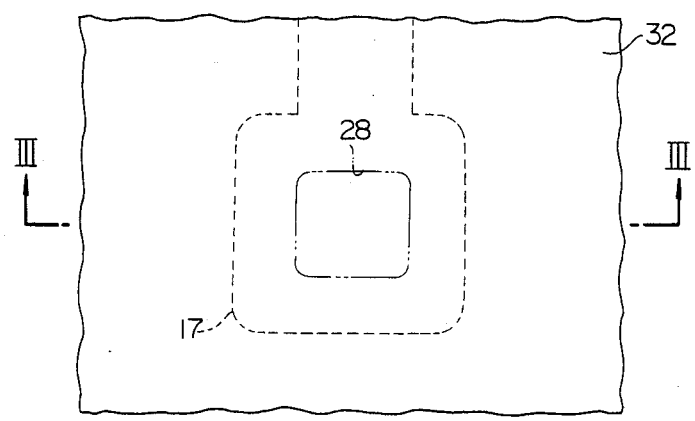
FIG. 2 is a fragmentary plan view showing part of the semiconductor integrated circuit structure including the prior-art input protection device illustrated in FIG. 1.
Figure 3:
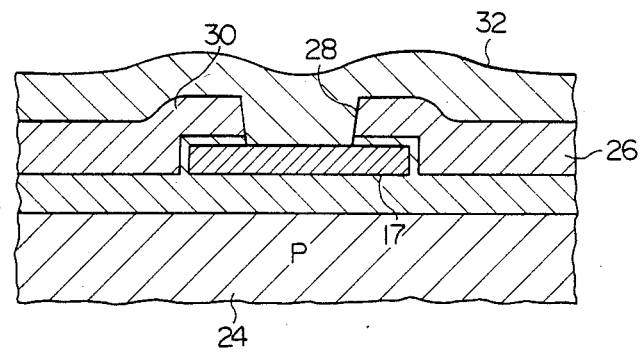
FIG. 3 is a fragmentary cross sectional view taken along line III—III in FIG. 2.
Figure 5:
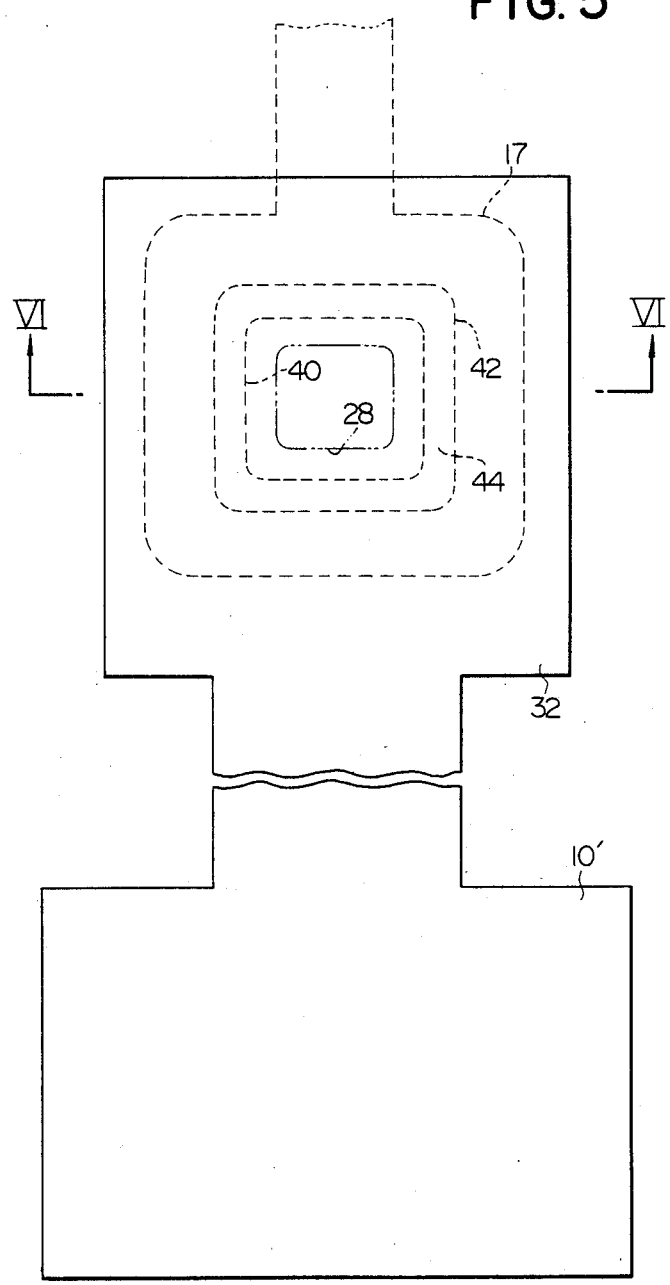
FIG. 5 is a fragmentary plan view showing part of the semiconductor integrated circuit structure including the input protection device illustrated in FIG. 4.
Figure 6:
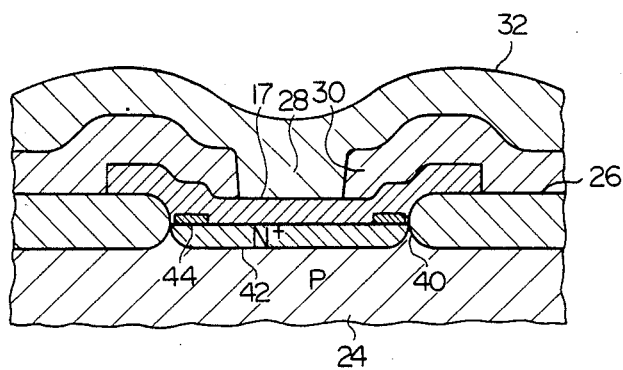
FIG. 6 is a fragmentary cross sectional view taken along line VI—VI in FIG. 5.

In FIGS. 5 and 6 of the drawings is illustrated the detailed configuration forming a portion "B" of the circuit arrangement shown in FIG. 4. As shown, the input protection resistors 16 and 18, now commonly represented by a patterned polysilicon resistor region 17 as in FIGS. 2 and 3, form part of a semiconductor integrated circuit provided on a silicon substrate 24, as shown in FIG. 6. Each of the transistors 14 and 20 being assumed to be an n-channel transistor, the substrate 24 is assumed to be of p-type silicon. The p-type silicon substrate 24 has a thin layer 26 of silicon oxide formed with an opening 40 on the surface of the substrate 24. A suitable donor-type dopant such as phosphorus is introduced either by diffusion or implant of ions into the silicon substrate 24 through this opening 40. A heavily n-type doped region 42 is thus formed in and coextensively with the opening 40 in the oxide layer 26 with a gate oxide film 42 formed along the perimeter of the region 42 as shown, defining an active surface area of the input protection resistor provided by the polysilicon resistor region 17. The polysilicon resistor region 17 is formed in part on this active surface area of the n-type doped region 42 through the opening 40 in the oxide layer 26 and in part on the oxide layer 26 and the gate oxide film 42. The polysilicon resistor region 17 and the silicon oxide layer 26 are covered with a conformally deposited insulator layer 30 which has a portion covering the input protection resistor region 17. This portion of the insulator layer 30 is formed with a contact hole 28 which extends to the surface of the resistor region 17 and which is at least in part in registry with the opening 40 in the oxide layer 40 which provides a first insulator layer in an input protection device according to the present invention. A metallized input wiring layer 32 of, for example, aluminum is deposited on this insulator layer 30 and has a contact region extending through the contact hole 30 in the insulator layer 28 to the surface of the polysilicon resistor 17. As shown in FIG. 5, the metallized input wiring layer 32 has an extension 10' forming the rod 10 illustrated in FIG. 4 and provides electrical connection between the input rod 10 and the resistor region 17, viz., each of the input protection resistors 16 and 18 in the arrangement shown in FIG. 4. The polysilicon resistor region 17 and the doped region 42 in the structure illustrated in FIGS. 5 and 6 are provided in association with the input transistor 12 and input protection transistor 20 in the circuit arrangement shown in FIG. 4. These transistors 14 and 20 are however not shown in FIGS. 5 and 6 for brevity of illustration and because of the fact that the configuration of each of such devices is apparent to those skilled in the art.

In the input protection device embodying the present invention, there is thus forming a p-n junction at the interface between the p-type silicon substrate 24 and the n-type doped region 42, thereby providing the diode 36 in the arrangement shown in FIG. 4. This p-n junction or diode 36 is reverse connected between the input rod 10 (FIG. 4) and the substrate 24 with its cathode grounded through the p-type silicon substrate 24. The diode 36 is thus reverse biased by the current which normally flows through the metallized input wiring layer 32 during operation of the integrated circuit. In the event a high voltage surge occurs at the input rod 10 and the voltage applied to the diode 36 reaches the Zener breakdown level of the p-n junction, the reverse connected diode 36 becomes conductive and provides a current path in addition to the current path established through the input protection resistors 16 and 18. The current with the high voltage surge is thus one one hand attenuated by the input protection resistors 16 and 18 and taken up by means of the input protection transistor 20 and is on the other hand passed through the diode 36 and the substrate 24 to the ground. All these effects contribute to relieving the input transistor 14 from the direct attack of the high voltage surge and provide reliability of projection from surge voltages which may be produced during operation of the integrated circuit.

While it has been assumed that each of the input protection transistor 20 of the input protection device 34 embodying the present invention is an n-channel field-effect transistor, the input protection transistor which form part of an input protection device according to the present invention may be constituted by a p-channel field-effect transistor or a p-n-p or n-p-n bipolar transistor. While, furthermore, the input transistor 14 of the semiconductor integrated circuit to which the input protection device 34 embodying the present invention is applied has also been assumed to be an n-channel field-effect transistor, an input protection device according to the present invention may also be applied to a semiconductor integrated circuit using a p-channel field-effect transistor or a p-n-p or n-p-n bipolar transistor as the input transistor thereof. Where a p-channel field-effect transistor is used as each of the input transistor 14 and the input protection transistor, n-type silicon is used as the substrate 24 so that the doped region 42 should be formed by introduction of an acceptor-type dopant such as bolon. In this instance, the diode or p-n junction which forms part of the modified embodiment of an input protection device according to the present invention has its anode connected to the input rod 10 and its cathode connected to ground through the n-type silicon substrate, though not shown in the drawings.

What is claimed is:
1. An input protection device for a semiconductor integrated circuit having an input transistors, said device comprising;
   (a) a semiconductor substrate of a first conductivity type;
   (b) a first insulator layer on saiid substrate, the first insulator layer having a first opening extending to the surface of said substrate;
   (c) a doped region formed in the surface portion of said substrate and open at said first opening, the doped region being of a second conductivity type which is opposite to said first conductivity type and forming a p-n junction at its interface with said substrate;
   (d) a patterned input protection resistor region having one end portion contacting said doped region through said first opening and a portion overlapping said first insulator layer so that the patterned input protection resistor region is wider than the first opening, said patterned input protection resistor region having the other end portion coupled to a gate electrode of said input transistor;
   (e) a second insulator layer having a portion covering said input protection resistor region, said portion of the second insulator layer having a second opening extending to the surface of the resistor region, the second opening in the second insulator layer being arranged to be nested in the first opening in said first insulator layer, thereby exposing a central zone of the surface of said one end portion of said patterned input protection resistor region; and
   (f) a metallized input wiring layer on said second insulator layer, the metallized input wiring layer having a region extending through said second opening in said second insulator layer to the central zone of the surface of said one end portion of said input protection resistor region contacting said doped region, said wiring layer being located over said doped region, a diode formed by said p-n junction being located in the vicinity of said one end portion of said patterned input protection resistor for protecting said patterned input protection resistor between the diode and said input transistor from an abnormal voltage supplied through said metallized input wiring layer.

2. An input protection device as set forth in claim 1, further comprising a field-effect transistor having its source and drain connected between said input protection resistor region and ground for providing an input transistor.

3. An input protection device for protecting a tranistor in a semiconductor integrated circuit including a reference voltage terminal, said device comprising:
   (a) an input pad;
   (b) a series circuit composed of first and second resistors and having an intermediate junction between the first and second resistors;
   (c) an input wiring element through which one end of said series circuit is connected to said input pad, the other end of the series circuit being coupled to said transistor;
   (d) a protection field-effect transistor having its drain-source current path connected between said intermediate junction and said reference voltage terminal, a gate electrode of said protection field effect transistor being coupled to said reference voltage terminal; and
   (e) a protection diode connected in a reverse direction between said one end of said series circuit and said reference voltage terminal, said protection diode including ($e_1$) a semiconductor substrate of a first conductivity type, ($e_2$) a doped region in said substrate, the doped region being of a second conductivity type which is opposite to said first conductivity type, ($e_3$) a first insulator layer on said substrate, the first insulator layer having a first opening for exposing at least a portion of said doped region, ($e_4$) a polysilicon resistor layer formed on said first insulator layer and having one end portion contacting said doped region through said first opening, said polysilicon resistor layer being wider than said first opening, said polysilicon resistor layer providing the first resistor of said series circuit and having the other end portion contacting said intermediate junction, ($e_5$) a second insulator layer having a portion covering said polysilicon resistor layer and having a second opening arranged to be nested in said first opening so as to expose a central zone of the polysilicon resistor layer, and ($e_6$) metallized wiring layer formed on said second insulator layer and contacting the central zone of said polysilicon resistor layer at that area over said opening, said metallized wiring layer providing a part of said input wiring element.

4. An input protection device for a semiconductor integrated circuit having an input transistor, comprising:
  (a) a semiconductor substrate of a first conductivity type;
  (b) a first insulator layer on said substrate, the first insulator layer having a first opening extending to the surface of said substrate;
  (c) a doped region formed in and substantially coextensive with said first opening for contacting said substrate, the doped region being of a second conductivity type which is opposite to said first conductivity type and forming a p-n junction at its interface with said substrate, said doped region having a peripheral surface portion;
  (d) a patterned input protection resistor region having one end portion contacting said doped region through said first opening and a portion overlapping said first insulator layer, said patterned input protection resistor region having the other end portion coupled to a gate electrode of said input transistor;
  (e) a second insulator layer having a portion covering said input protection resistor region, said portion of the second insulator layer having a second opening extending to the surface of the resistor region, the second opening in the second insulator layer being nested in the opening in said first insulator layer; and
  (f) a metallized input wiring layer on said second insulator layer, the metallized input wiring layer having a region extending through said second opening in said second insulator layer to the surface of said one end portion of said input protection resistor region contacting said doped region, said wiring layer being located over said doped region, a diode forming by said p-n junction being located in the vicinity of said one end portion of said patterned input protection resistor for preventing said patterned input protection resistor between the diode and said input transistor from an abnormal voltage supplied through said metallized input wiring layer.

* * * * *